United States Patent

Wu et al.

[11] Patent Number: 5,821,564
[45] Date of Patent: Oct. 13, 1998

[54] TFT WITH SELF-ALIGN OFFSET GATE

[75] Inventors: Hsiao-Chia Wu; Jung-Cheng Kao, both of Hsinchu; Thomas Chang, Taichung, all of Taiwan

[73] Assignee: Mosel Vitelic Inc., Hsinchu, Taiwan

[21] Appl. No.: 862,318

[22] Filed: May 23, 1997

[51] Int. Cl.$^6$ .................... H01L 27/108; H01L 29/76; H01L 27/01; H01L 27/11
[52] U.S. Cl. ............... 257/66; 257/903; 257/350; 257/69
[58] Field of Search ............... 257/66, 350, 351, 257/69, 903, 329, 347, 372, 401; 438/151, 159, 166, 286, 150

[56] References Cited

U.S. PATENT DOCUMENTS

| | | | |
|---|---|---|---|
| 5,198,379 | 3/1993 | Adan | 438/286 |
| 5,305,128 | 4/1994 | Stupp et al. | 257/350 |
| 5,438,540 | 8/1995 | Kim | 257/66 |
| 5,488,005 | 1/1996 | Han et al. | 438/163 |
| 5,528,056 | 6/1996 | Shimada et al. | 257/351 |
| 5,612,235 | 3/1997 | Wu et al. | 438/166 |

OTHER PUBLICATIONS

Failure in CMOS circuits induced by hot carriers in multi-–gate transistors. New York, NY, USA: IEEE, 1988, pp. 26–29, Apr. 12–14, 1988.

*Primary Examiner*—Tom Thomas
*Assistant Examiner*—Cuong Quan Nguyen
*Attorney, Agent, or Firm*—Bacon & Thomas, PLLC

[57] ABSTRACT

A PMOS thin film transistor (TFT) with self-align offset region for SRAM application is described. A source and a drain regions are above the gate region. A channel region is formed offset from the gate. An offset region is formed in the channel region having a length of 0.3 to 0.4 $\mu$m. The key point of the present invention is the novel offset design of PMOS-TFT as load elements in an SRAM cell. Unlike the conventional offset design which is outside the gate, the offset region of the present invention is a disconnection region inside the gate which can be easily formed by so called self-align technique. Since the gate has a disconnected portion in the offset region, the trench-like profile of the offset region makes the load resistance in the offset region much higher to effectively reduce the leakage current.

6 Claims, 4 Drawing Sheets

TFT WITH SELF-ALIGN OFFSET GATE

BACKGROUND OF THE INVENTION (a) Field of the Invention

This invention relates to semiconductor device technology, and more particularly to the fabrication of static random access memory (SRAM) with a self-align offset gate structure.

(b) Description of the Prior Art

In general, an SRAM memory is faster and easier to use than a Dynamic RAM (DRAM) device. Because of this reason, SRAMs are widely used in applications which require smaller memory capacity.

The conventional SRAM comprises a Metal-oxide-Semiconductor (MOS) transistor or a resistor as the load elements. Often used for the load element is an easily made high resistance polysilicon resistor. The advantage of using polysilicon resistor as load elements is that it consumes a lower amount of power. However, the difference of the current through the polysilicon resistor load elements and the leakage current becomes too small that degrades the performance of the SRAM devices.

On the other hand, an SRAM device having PMOS thin film transistors (TFTs) as load elements has a high ON/OFF current ratio to improve the memory retention in the memory cell. But relatively high leakage current still is a problem. There are many methods to dealt with this issue. For example, U.S. Pat. No. 5,574,294 to J. F. Shepard (the entire disclosure of which is herein incorporated by reference) discloses a process for making a dual gated TFT, having a sidewall channel and self-aligned gate and offset drain. U.S. Pat. No. 5,401,982 to King et al. (the entire disclosure of which is herein incorporated by reference) described a two dimensional channel TFT. These structures are too complicated and highly fastidious to be practically employed for mass-production.

Therefore, an SRAM device having a PMOS TFT load element with an offset region formed between the gate and drain regions is proposed to reduce leakage current. See a paper entitled "A 0.1 $\mu$A standby current, Ground-Bounce-Immune 1-Mbit CMOS SRAM" by Manabu Ando et al., IEEE SC-24, P 1708, 1989 (the entire disclosure of which is herein incorporated by reference).

Referring now to FIG. 1, there is shown the cross sectional view of a conventional SRAM cell which comprises a driving transistor and a PMOS-TFT load. An insulating layer 18 and a polysilicon gate 12 are formed on a substrate 10. A P-channel region is formed by doping $P^-$ impurities. The source 16 and drain 14 regions are formed at the ends of the channel. An offset region 28 is formed between drain and gate regions to increase the load resistance, and thus reduce the leakage current. These regions are made the PMOS-TFT load. On the right hand side of the PMOS-TFT, the driving transistor which consists of $N^+$ doping regions 22 and a gate 20 is also formed. An n-type polysilicon layer 24 connects the drain 14 of the PMOS-TFT and $N^+$ doping region 22 of the driving transistor.

In current SRAM technology, the channel length is typically 1.3 $\mu$m with an offset region of 0.3 to 0.4 $\mu$m and the channel width is 0.6 $\mu$m.

Referring now to FIG. 2, there is shown the circuit layout diagram corresponding to FIG. 1. The resistance value of the PMOS-TFT load exceedingly depends on the length of the offset region. If the offset region is too short, the resistance of the PMOS-TFT becomes too small, thus high leakage current. On the other hand, if the offset region is too long, the conducting current is too small that degrades the performance of the PMOS-TFT. Therefore, how to precisely control the offset region length of the PMOS-TFT is a top priority for the semiconductor industry.

In the conventional SRAM process, the offset region is defined by a mask. However, there is always a concern of misalignment and critical dimension (CD) variation to affect the exact length of offset during lithography step. The present invention describes a novel PMOS-TFT design with self-align offset region to effectively solve the above mentioned problems.

SUMMARY OF THE INVENTION

The primary object of the present invention is to provide a novel PMOS-TFT structure which can be employed in SRAM.

Another object of the present invention is to provide a method of fabricating self-align offset region of a PMOS-TFT which can improve the performance of SRAM due to offset misalignment of the conventional process.

A further object of the present invention is to provide a method of fabricating self-align offset region of a PMOS-TFT which can reduce the number of processing steps.

Yet a still further object of the present invention is to provide a method of fabricating a PMOS-TFT to increase the resistance of the offset region, and thus reduce the leakage current.

In accordance with the present invention, the above mentioned objects are achieved by providing a method for fabricating an offset PMOS-TFT for SRAM. A source and a drain regions are above the gate region. A channel region is formed offset from the gate. An offset region is formed in the channel region having a length of 0.3 to 0.4 $\mu$m. The key point of the present invention is the novel offset design of PMOS-TFT as load elements in an SRAM cell. Unlike the conventional offset design which is outside the gate, the offset region of the present invention is a disconnection region inside the gate which can be easily formed by so called self-align technique.

Since the gate has a disconnected portion in the offset region, the trench-like profile of the offset region makes the load resistance in the offset region much higher than that of conventional design. Besides, the offset region is formed by the self-align method without the concerns of misalignment and critical dimension variation.

BRIEF DESCRIPTION OF THE DRAWINGS

In the accompanying drawings forming a material part of this description, there is shown.

DESCRIPTION OF THE PREFERRED EMBODIMENTS

The invention disclosed herein is directed to a method for manufacturing the self-align offset structure of a PMOS-TFT for SRAM. In the following description, numerous details are set forth in order to provide a thorough understanding of the present invention. It will be appreciated by one skilled in the art that variations of these specific details are possible still achieving the results of the present invention. In other instance, well-known processing steps are not described in detail in order not to unnecessarily obscure the present invention.

Figure 1:
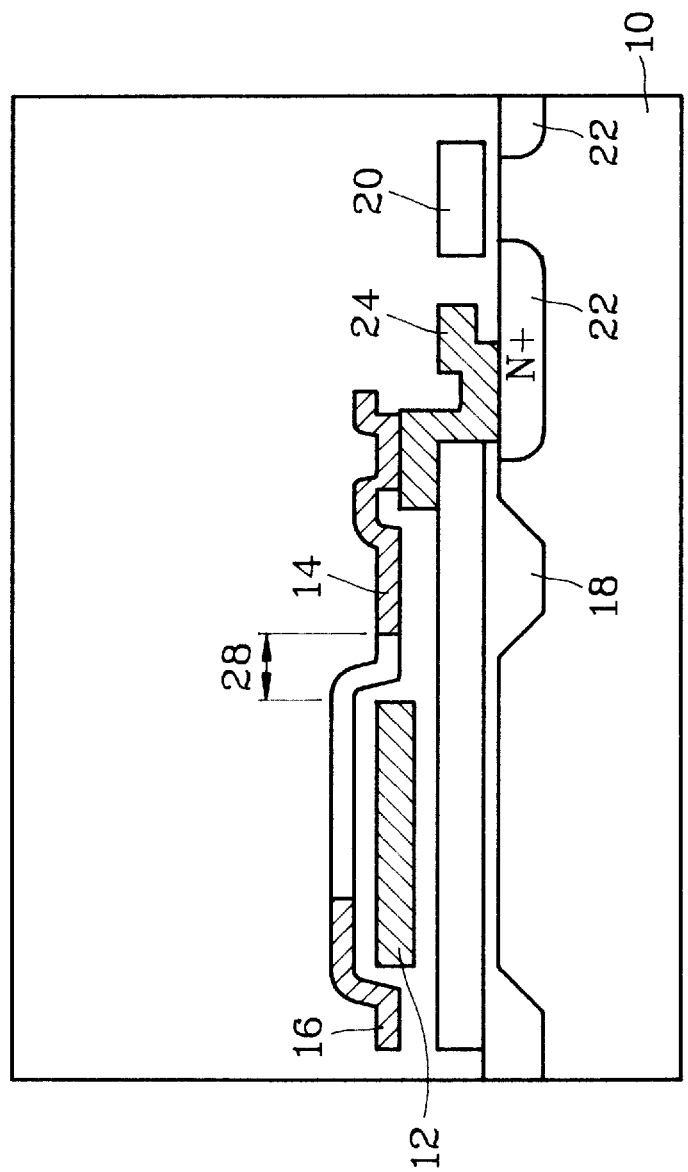
FIG. 1 illustrates the cross sectional view of a TFT-SRAM according to the prior art.
Figure 3:
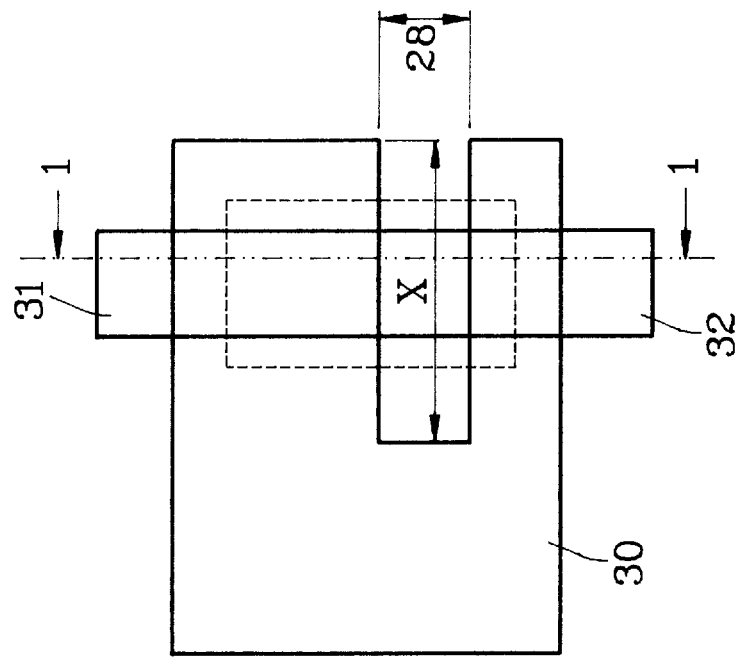
FIG. 3 illustrates the PMOS-TFT for SRAM circuit layout according to the present invention.
Figure 2:
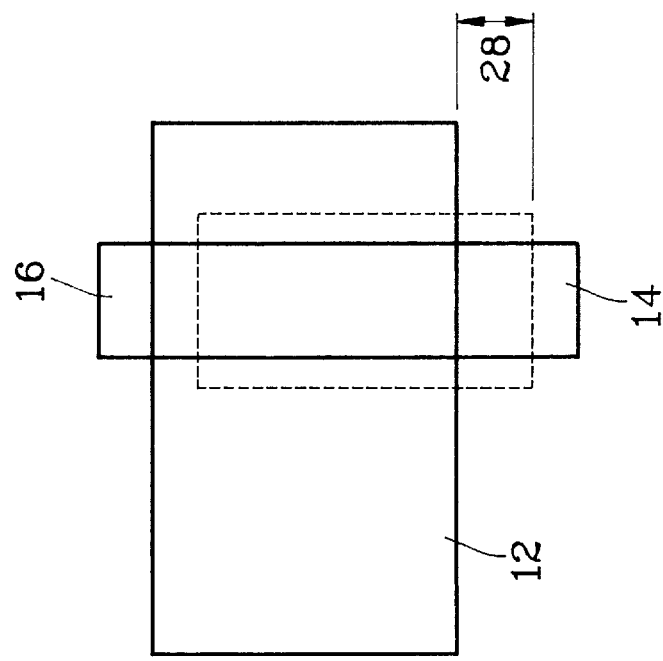
FIG. 2 illustrates the top view of the TFT-SRAM of FIG. 1 according to the prior art.

The key point of the present invention is the novel offset design of PMOS-TFT as load elements in an SRAM cell. Referring now more particularly to FIG. 3, there is shown the PMOS-TFT circuit layout according to the present invention. A source 31 and a drain 32 regions are above the gate region 30. A channel region is formed offset from the gate. An offset region 28 is formed in the channel region having a length of 0.3 to 0.4 $\mu$m. Unlike the conventional offset gate layout of FIG. 2 which is outside the gate, the offset region 28 of the present invention is a disconnection region inside the gate which can be easily formed by so called self-align technique. The offset region 28 has an open end and a closed end, where the offset is horizontally away from the gate with a predetermined distance X.

Figure 4:
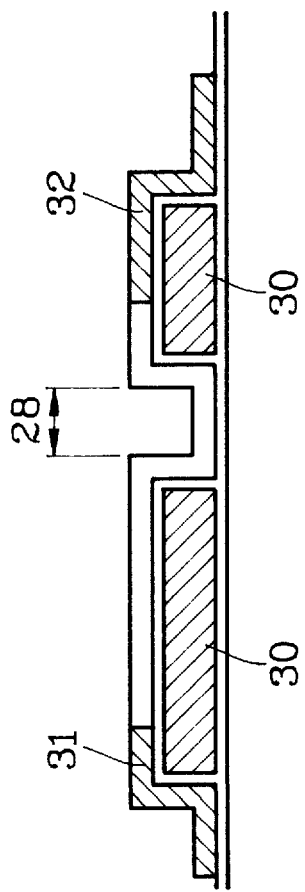
FIG. 4 is the cross sectional view of the PMOS-TFT for SRAM of FIG. 3 from the 1—1 direction according to the present invention.

Referring now to FIG. 4, there is shown the cross sectional view of the PMOS-TFT from 1—1 direction of the FIG. 3 according to the present invention. The gate regions 30 are formed on a substrate. The source 31 and drain 32 are formed above the gate region. Since the gate regions 30 are disconnected in the offset region 28, the trench-like profile of the offset region makes the load resistance in the offset region much higher than that of conventional design. Besides, the offset region is formed by the self-align method without the concerns of misalignment and critical dimension variation. Therefore, the length of the offset region is easier to control that improve the yield and performance of the PMOS-TFT for SRAM application.

Figure 5:
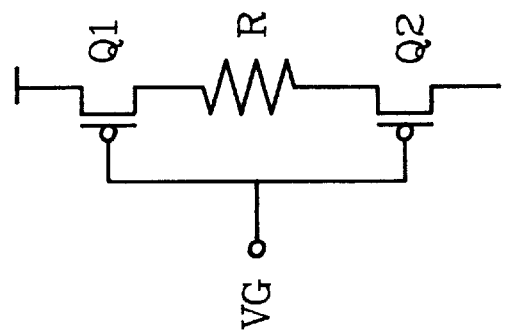
FIG. 5 is the equivalent circuit diagram of the PMOS-TFT for SRAM of FIG. 3 according to the present invention.

Referring now to FIG. 5, there is shown the equivalent circuit diagram of FIG. 3 according to present invention. When a positive gate voltage $V_G$ is applied, both PMOS transistors Q1, and Q2 are turned off. Because the offset resistance R is high, the leakage current is then kept low. On the other hand, a negative gate voltage is applied both PMOS transistors Q1 and Q2 are turned on as the conventional PMOS-TFT would without sacrificing the performance of the SRAM.

Figure 6:
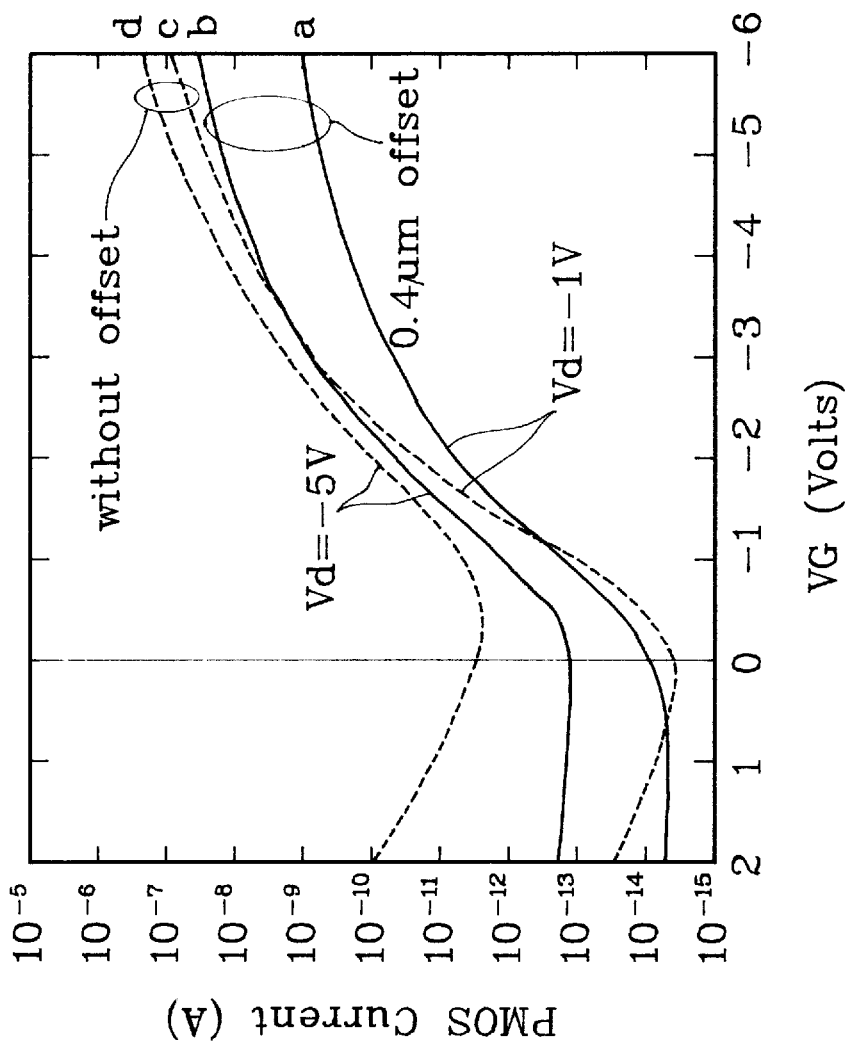
FIG. 6 shows the gate voltage versus drain current characteristics of the PMOS-TFT according to the present invention.

Referring now to FIG. 6, there are shown the I–V characteristics of PMOS TFT'S with or without offset regions. Curves a and c are the I–V relationship with or without the offset regions when a –1 volt drain voltage $V_d$ is applied, while curve b and d are the I–V relationship without offset when a –5 V drain voltage $V_d$ is applied. As we can see, the leakage current is at least one order of magnitude lower with an offset region. According to the present invention, the PMOS-TFT with an offset region enhances the overall electrical performance of the SRAM device.

While the present invention has been particularly shown and described with reference to a preferred embodiment, it will be understood by those skilled in the art that various changes in form and detail may be without departing from the spirit and scope of the present invention.

What we claimed is:

1. An offset structure of PMOS thin film transistor, wherein said PMOS thin film transistor comprises:

a gate region having a disconnected portion;

a source region being above said gate region;

a drain region being above said gate region;

a first channel region being above said gate region and adjacent to said source region and substantially aligned with said gate;

a second channel region being above said gate region and adjacent to said drain region and substantially aligned with said gate;

an offset region disposed between said first channel region and said second channel region and being in said gate disconnection portion;

and wherein said offset region has a trench-like profile.

2. The structure of claim 1, wherein said self-align offset has one open end and one closed end, said offset in closed end being horizontally across said first channel and said second channel, with a predetermined distance to said gate.

3. The structure of claim 1, wherein said offset is 0.3 to 0.4 $\mu$m long.

4. A Load element of SRAM, comprising:

a thin film transistor, wherein said thin film transistor comprises a notched gate structure so that at least one interstice is defined within, source/drain regions beside said notched gate structure and channel regions above said notched gate structure; and at least one offset region inside said interstice.

5. A Load element of SRAM, comprising:

a gate, wherein said gate is a broach-like structure so that at least one interstice is defined within;

a dielectric layer adjoined with said gate;

a polysilicon layer adjoined with said dielectric layer and crossed to said gate and said interstice, comprising at least one undoped region in said interstice; and wherein said undoped region is served as an offset structure.

6. A Load element of SRAM, comprising;

a gate having at least one gap within so that at least one interstice is defined inside;

a dielectric layer adjoined with said gate;

a polysilicon layer adjoined with said dielectric layer and crossed to said gate and said interstice; comprising at least one undoped region in said interstice; and wherein said undoped region is served as an offset structure.

* * * * *